US011104995B2

(12) United States Patent
Yahata et al.

(10) Patent No.: US 11,104,995 B2
(45) Date of Patent: Aug. 31, 2021

(54) SUBSTRATE PROCESSING APPARATUS

(71) Applicant: Hitachi Kokusai Electric Inc., Tokyo (JP)

(72) Inventors: Takashi Yahata, Toyama (JP); Satoshi Takano, Toyama (JP); Kazuyuki Toyoda, Toyama (JP); Naofumi Ohashi, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 509 days.

(21) Appl. No.: 15/457,686

(22) Filed: Mar. 13, 2017

(65) Prior Publication Data
US 2017/0283949 A1 Oct. 5, 2017

(30) Foreign Application Priority Data

Mar. 31, 2016 (JP) .............................. JP2016-070369

(51) Int. Cl.
*C23C 16/46* (2006.01)
*C23C 16/455* (2006.01)
(Continued)

(52) U.S. Cl.
CPC ............ *C23C 16/46* (2013.01); *C23C 16/345* (2013.01); *C23C 16/45544* (2013.01);
(Continued)

(58) Field of Classification Search
CPC ............ C23C 16/345; C23C 16/45544; C23C 16/45561; C23C 16/45565; C23C 16/46; C23C 16/52
See application file for complete search history.

(56) References Cited

U.S. PATENT DOCUMENTS

2004/0048493 A1  3/2004 Matsuoka
2008/0099145 A1  5/2008 Keller
(Continued)

FOREIGN PATENT DOCUMENTS

JP   1997232290 A   9/1997
JP   2002222804 A   8/2002
(Continued)

OTHER PUBLICATIONS

Office Action in corresponding Korean Patent Application No. 10-2017-0025269, dated May 31, 2017, along with English translation.
(Continued)

*Primary Examiner* — Hua Qi
(74) *Attorney, Agent, or Firm* — Edell, Shapiro & Finnan, LLC

(57) ABSTRACT

Disclosed is a substrate processing apparatus capable of improving the characteristic of a film formed on the surface of a wafer, using a single-wafer type substrate processing apparatus which heats and processes a wafer. The substrate processing apparatus may include: a processing vessel where a substrate is processed; a substrate supporter including: a first heater configured to heat the substrate to a first temperature; and a substrate placing surface where the substrate is placed; a heated gas supply system including a second heater configured to heat an inert gas, wherein the heated gas supply system is configured to supply a heated inert gas into the processing vessel; and a controller configured to control the first heater and the second heater such that a temperature of a front surface of the substrate and a temperature of a back surface of the substrate are in a predetermined range.

20 Claims, 13 Drawing Sheets

(51) Int. Cl.
    C23C 16/34    (2006.01)
    C23C 16/52    (2006.01)
(52) U.S. Cl.
    CPC .. *C23C 16/45561* (2013.01); *C23C 16/45565* (2013.01); *C23C 16/52* (2013.01)

(56) References Cited

U.S. PATENT DOCUMENTS

| | | | |
|---|---|---|---|
| 2009/0117746 A1* | 5/2009 | Masuda | H01L 21/67069 438/710 |
| 2009/0208650 A1* | 8/2009 | Narushima | C23C 16/4404 427/250 |
| 2010/0233876 A1* | 9/2010 | Matsumoto | H01L 21/28562 438/652 |
| 2012/0052216 A1 | 3/2012 | Hanawa et al. | |
| 2013/0333619 A1* | 12/2013 | Omori | C23C 14/564 118/723 R |
| 2015/0184301 A1 | 7/2015 | Saido | |
| 2015/0294860 A1 | 10/2015 | Ohashi | |
| 2016/0376699 A1 | 12/2016 | Sasaki et al. | |

FOREIGN PATENT DOCUMENTS

| | | |
|---|---|---|
| JP | 2002313796 A | 10/2002 |
| JP | 2002359251 A | 12/2002 |
| JP | 2005072490 A | 3/2005 |
| JP | 2012054399 A | 3/2012 |
| JP | 0005940199 A | 6/2016 |
| KR | 1020060051861 | 5/2006 |
| KR | 1020070026210 A | 3/2007 |
| KR | 1020130093113 A | 8/2013 |
| KR | 1020150088238 A | 7/2015 |

OTHER PUBLICATIONS

Office action in corresponding Japanese Patent Application No. 2016-070369, drafted on Aug. 17, 2017.

Office Action in corresponding Korean Patent Application No. 10-2017-0025269, dated Dec. 23, 2017, with English translation.

Office Action in corresponding Chinese Patent Application No. 201710123023.5, dated Feb. 3, 2020, with English translation.

* cited by examiner

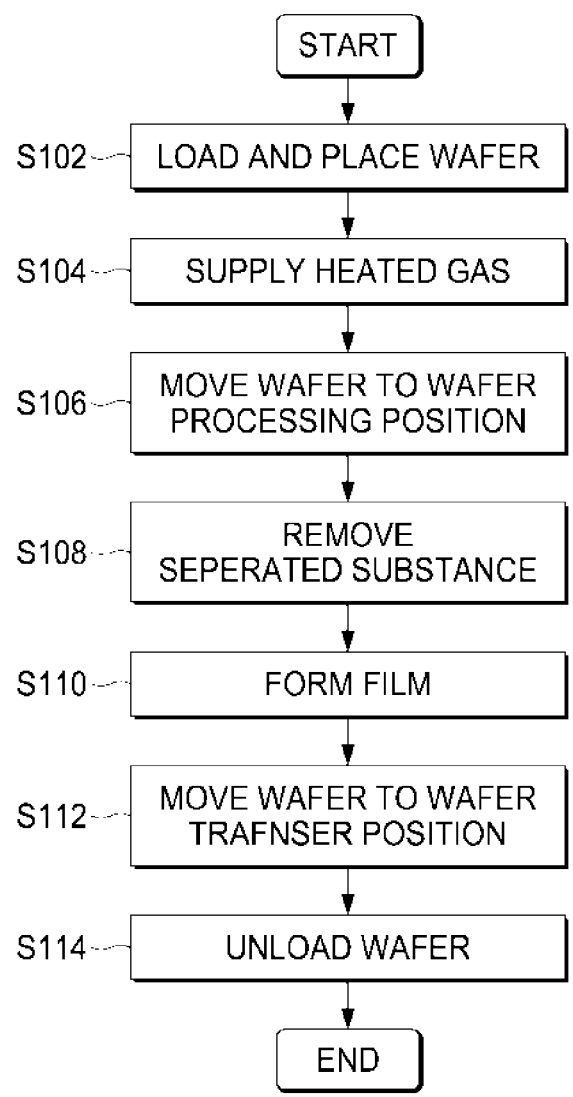

SUBSTRATE PROCESSING APPARATUS

CROSS REFERENCE TO RELATED APPLICATIONS

This application claims foreign priority under 35 U.S.C. § 119(a)-(d) to Application No. JP 2016-070369, filed on Mar. 31, 2016, the entire contents of which are hereby incorporated by reference.

FIELD OF THE INVENTION

The present disclosure relates to a substrate processing apparatus.

BACKGROUND

A single-wafer type substrate processing apparatus that processes wafers one by one is one of apparatuses for manufacturing a semiconductor device. For example, by supplying a gas onto a wafer while heating the wafer, using a single-wafer type substrate processing apparatus, a film constituting a part of the semiconductor device is formed on the wafer.

The single-wafer type substrate processing apparatus processes one wafer at a time. Therefore, the yield needs to be improved. In order to improve the yield, the characteristic of a film formed on the surface of a wafer needs to be improved.

SUMMARY

Described herein is a technique capable of improving the characteristic of a film formed on the surface of a wafer, using a single-wafer type substrate processing apparatus which heats and processes a wafer.

According to one aspect described herein, a substrate processing apparatus may include: a processing vessel where a substrate is processed; a substrate supporter including: a first heater configured to heat the substrate to a first temperature; and a substrate placing surface where the substrate is placed; a heated gas supply system including a second heater configured to heat an inert gas, wherein the heated gas supply system is configured to supply a heated inert gas into the processing vessel; and a controller configured to control the first heater and the second heater such that a temperature of a front surface of the substrate and a temperature of a back surface of the substrate are in a predetermined range.

BRIEF DESCRIPTION OF THE DRAWINGS

FIG. 3 is a flowchart schematically exemplifying substrate processing according to the first embodiment described herein.

DETAILED DESCRIPTION

Hereinafter, embodiments of the present disclosure will be described.

First Embodiment

First, a first embodiment will be described.

(1) Configuration of Substrate Processing Apparatus

Figure 1:
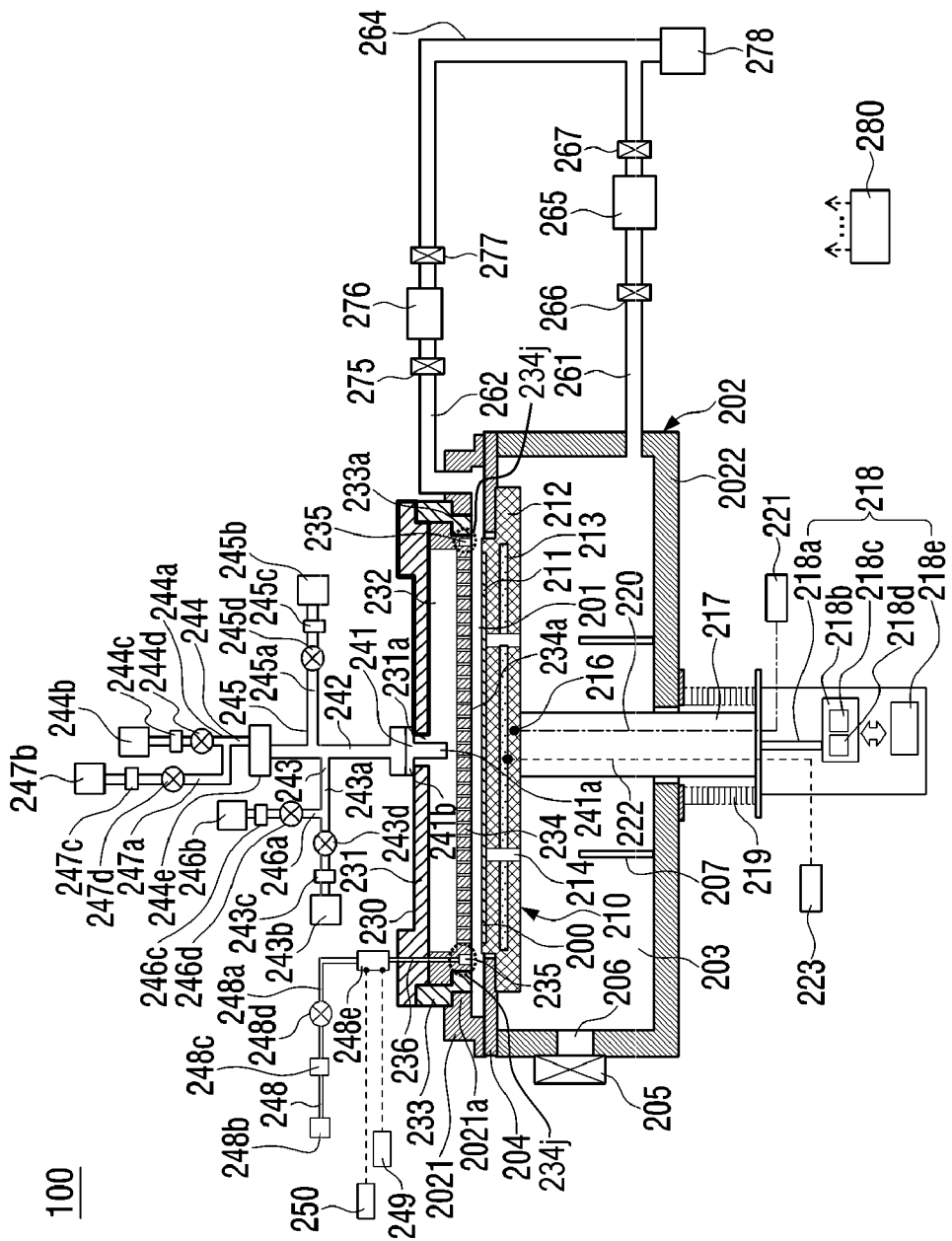
FIG. 1 is a diagram schematically exemplifying a configuration of a substrate processing apparatus according to a first embodiment described herein.

FIG. 1 is a diagram schematically exemplifying a configuration of a substrate processing apparatus according to a first embodiment. Hereafter, components of the substrate processing apparatus will be described in detail.

Processing Vessel

Referring to FIG. 1, the substrate processing apparatus 100 includes a processing vessel 202. The processing vessel 202 is a flat airtight vessel having a circular cross-section. The processing vessel 202 includes an upper vessel 2021 made of a non-metallic material such as quartz and ceramics and a lower vessel 2022 made of a metallic material such as aluminum (Al) and stainless steel (SUS). The processing vessel 202 includes a processing space 201 and a transfer space 203, and the processing space 201 is also referred to as a processing chamber. The processing space 201 is where a wafer 200 such as a silicon wafer serving as a substrate is processed, and formed above a substrate support 212 in the processing vessel 202. The substrate support 212 will be described later. The transfer space 203 is formed under the processing space 201, and surrounded by the lower vessel 2022.

A substrate loading/unloading port 206 is disposed at a side surface of the lower vessel 2022 so as to be adjacent to a gate valve 205. The wafer 200 may be loaded into the transfer space 203 through the substrate loading/unloading port 206. Lift pins 207 are installed at the bottom of the lower vessel 2022.

Substrate Supporter

A substrate supporter (susceptor) 210 for supporting the wafer 200 is installed in the processing space 201. The substrate supporter 210 includes the substrate support 212 which has a substrate placing surface 211 for placing the wafer 200 and a heater 213 which is embedded in the substrate support 212 and serves as a first heater. The substrate supporter 210 may further include a temperature measurement terminal 216 to measure the temperature of the heater 213. The temperature measurement terminal 216 is connected to a temperature measurement unit 221 through a wire 220.

The substrate support 212 has through-holes 214 through which the lift pins 207 are passed, the through-holes 214 disposed at positions corresponding to the respective lift pins 207. A wire 222 may be connected to the heater 213, and provide power to the heater 213. The wire 222 is connected to a heater power controller (heater power control unit) 223.

The temperature measurement unit 221 and the heater power controller 223 are connected to a controller 280 described later. The controller 280 generates control information, based on the temperature measured by the temperature measurement unit 221, and transmits the control information to the heater power controller 223. The heater power controller 223 controls the heater 213 based on the received control information.

The substrate support 212 is supported by a shaft 217. The shaft 217 is installed through the bottom of the processing vessel 202, and connected to an elevating part 218 outside the processing vessel 202.

The elevating part 218 includes a support shaft 218a for supporting the shaft 217 and an operating part 218b for moving upward/downward or rotating the support shaft 218a. The operating part 218b includes an elevating mechanism 218c and a rotating mechanism 218d. The elevating mechanism 218c includes a motor for moving upward/downward the support shaft 218a, and the rotating mechanism 218d includes a gear wheel for rotating the support shaft 218a. A lubrication material such as grease is applied to the support shaft 218a and the operating part 218b, such that the support shaft 218a and the operating part 218b are smoothly operated.

The elevating part 218 may further include an instruction part 218e for transmitting an elevation instruction or rotation instruction to the operating part 218b. The instruction part 218e is electrically connected to the controller 280. The instruction part 218e controls the operating part 218b based on an instruction of the controller 280. As described later, the operating part 218b controls the substrate support 212 to move to a wafer transfer position or wafer processing position.

As the elevating part 218 is operated to move upward/downward the shaft 217 and the substrate support 212, the wafer 200 placed on the substrate placing surface 211 may be moved upward/downward. A bellows 219 covers the lower portion of the shaft 217. Thus, the processing space 201 is airtightly retained.

When the wafer 200 is transferred, the substrate support 212 is moved downward until the substrate placing surface 211 is set at the position (wafer transfer position) of the substrate loading/unloading port 206. When the wafer 200 is processed, the substrate support 212 is moved upward until the wafer 200 is set at a processing position (wafer processing position) in the processing space 201.

More specifically, when the substrate support 212 is moved downward to the wafer transfer position, the upper ends of the lift pins 207 protrude from the substrate placing surface 211, and the lift pins 207 support the wafer 200 from thereunder. When the substrate support 212 is moved upward to the wafer processing position, the lift pins 207 are buried from the substrate placing surface 211, and the substrate placing surface 211 supports the wafer 200 from thereunder.

Shower Head

A shower head 230 serving as a gas dispersion mechanism is installed at a location above the processing space 201, facing the substrate placing surface 211, that is, the upstream side of a gas supply system. The shower head 230 is installed in the upper vessel 202l through a hole 202la disposed at the upper vessel 202l, for example.

A lid 231 of the shower head is made of a metal with conductivity and thermal conductivity, for example. A block 233 is installed between the lid 231 and the upper vessel 202l. The block 233 insulates the lid 231 and the upper vessel 202l from each other.

A gas inlet 231a into which a gas supply pipe 241 serving as a first dispersion mechanism is inserted is disposed at the lid 231 of the shower head. The gas supply pipe 241 inserted into the gas inlet 231a includes a front end portion 241a and a flange 241b. The front end portion 241a is inserted into the shower head 230 in order to disperse gas supplied into a shower head buffer chamber 232 corresponding to the space in the shower head 230, and the flange 241b is fixed to the lid 231. The front end portion 241a has a cylindrical shape, for example. The front end portion 241a has a dispersion hole (not illustrated) disposed at a side thereof. A gas supplied through a gas supply part (supply system) described later is supplied into the shower head buffer chamber 232 through the dispersion holes formed at the front end portion 241a.

The shower head 230 includes a dispersion part 234 serving as a second dispersion mechanism for dispersing the gas supplied through the gas supply part (supply system) described later. The shower head buffer chamber 232 corresponds to the upstream side of the dispersion part 234, and the processing space 201 corresponds to the downstream side of the dispersion part 234. The dispersion part 234 has through-holes 234a formed therein. The dispersion part 234 is installed above the substrate placing surface 211 so as to face the substrate placing surface 211. Therefore, the shower head buffer chamber 232 communicates with the processing space 201 through the through-holes 234a formed in the dispersion part 234.

A heated gas supply structure 235 is circumferentially disposed at locations different from the locations where the through-holes 234a of the dispersion part 234 are disposed. The heated gas supply structure 235 is installed outside the through-holes 234a, for example. That is, the heated gas supply structure 235 is disposed at a peripheral portion 234j of the dispersion part 234 radially outside the through-holes 234a. The heated gas supply structure 235 includes supply holes 235a. The supply holes 235a are circumferentially arranged. The processing chamber 201 communicates with the heated gas supply structure 235 at the downstream side of the heated gas supply structure 235. The gas supply pipe 236 is connected to the upstream side of the heated gas supply structure 235 at the peripheral portion 234j of the dispersion part 234. The gas supply pipe 236 is connected to a heated gas supply pipe 248a described later. In the first embodiment, the heated gas supply structure 235 including the supply holes 235a is exemplified. However, the first embodiment is not limited thereto. The heated gas supply structure 235 may include one or more slits which are circumferentially disposed.

Gas Supply System

A common gas supply pipe 242 is connected to the gas supply pipe 241 inserted into the gas inlet 231a. The gas supply pipe 241 and the common gas supply pipe 242 communicate with each other. The gas supplied through the common gas supply pipe 242 is supplied into the shower head 230 through the gas supply pipe 241 and the gas inlet 231a.

A first gas supply pipe 243a, a second gas supply pipe 244a and a third gas supply pipe 245a are connected to the common gas supply pipe 242. The second gas supply pipe 244a is connected to the common gas supply pipe 242 through a remote plasma unit 244e.

A first element containing gas is supplied mainly through a first gas supply system 243 including the first gas supply pipe 243a. A second element containing gas is supplied mainly through a second gas supply system 244 including the second gas supply pipe 244a. When the wafer 200 is processed, an inert gas is supplied mainly through a third gas supply system 245 including the third gas supply pipe 245a. When the shower head 230 or the processing space 201 is cleaned, a cleaning gas is supplied mainly through the third gas supply system 245 including the third gas supply pipe 245a.

First Gas Supply System

A first gas supply source 243b, an MFC (Mass Flow Controller) 243c serving as a flow controller, and a valve 243d serving as an opening/closing valve are sequentially installed at the first gas supply pipe 243a from the upstream side to the downstream side of the first gas supply pipe 243a. The first element containing gas (hereafter, also referred to as "first gas") is supplied into the shower head 230 from a first gas supply source 243b through the MFC 243c and the valve 243d, which are installed at the first gas supply pipe 243a, via the common gas supply pipe 242.

The first element containing gas is one of process gases, and serves as a source gas. In the first embodiment, the first element includes silicon (Si), for example. That is, the first element containing gas includes a silicon containing gas, for example. The first element containing gas is any one of solid, liquid and gas at normal temperature and pressure. When the first element containing gas is in a liquid state at normal temperature and pressure, an evaporator (not illustrated) may be installed between the first gas supply source 243b and the MFC 243c. In the first embodiment, the case that the first element containing gas is in a gaseous state is exemplified.

The downstream end of a first inert gas supply pipe 246a is connected to the downstream side of the valve 243d of the first gas supply pipe 243a. An inert gas supply source 246b, an MFC 246c and a valve 246d serving as an opening/closing valve are sequentially installed at the first inert gas supply pipe 246a from the upstream side toward the downstream side of the first inert gas supply pipe 246a. The inert gas is supplied into the shower head 230 from the inert gas supply source 246b through the MFC 246c and the valve 246d, which are installed at the first inert gas supply pipe 246a, via the first gas supply pipe 243a and the common gas supply pipe 242.

In the first embodiment, the inert gas serves as a carrier gas of the first element containing gas. Desirably, a gas which does not react with the first element is used as the inert gas. Specifically, nitrogen ($N_2$) gas may be used as the inert gas. Instead of $N_2$ gas, rare gases such as helium (He) gas, neon (Ne) gas and argon (Ar) gas may be used as the inert gas.

The first gas supply system 243 (also referred to as "silicon containing gas supply system") includes the first gas supply pipe 243a, the MFC 243c and the valve 243d. A first inert gas supply system includes the first inert gas supply pipe 246a, the MFC 246c and the valve 246d.

The first gas supply system 243 may further include the first gas supply source 243b and the first inert gas supply system. The first inert gas supply system may further include the inert gas supply source 246b and the first gas supply pipe 243a. Since the first gas supply system 243 supplies the source gas which is one of the process gases, the first gas supply system 243 is a part of the process gas supply system.

Second Gas Supply System

The remote plasma unit 244e is installed at the downstream side of the second gas supply pipe 244a. A second gas supply source 244b, an MFC 244c serving as a flow controller, and a valve 244d are sequentially installed at the second gas supply pipe 244a from the upstream side toward the downstream side of the second gas supply pipe 244a. The second element containing gas (hereafter, also referred to as "second gas") is supplied into the shower head 230 from the second gas supply source 244b through the MFC 244c, the valve 244d and the remote plasma unit 244e, which are installed at the second gas supply pipe 244a, via the common gas supply pipe 242. The second element containing gas is converted into plasma by the remote plasma unit 244e, and supplied to the wafer 200.

The second element containing gas is one of the process gases, and serves as a reaction gas or modification gas. In the first embodiment, the second element containing gas contains a second element different from the first element. The second element includes any one of oxygen (O), nitrogen (N) and carbon (C), for example. In the first embodiment, a nitrogen containing gas is used as the second element containing gas. Specifically, ammonia ($NH_3$) gas is used as the nitrogen containing gas.

The downstream end of a second inert gas supply pipe 247a is connected to the downstream side of the valve 244d of the second gas supply pipe 244a. An inert gas supply source 247b, an MFC 247c and a valve 247d are sequentially installed at the second inert gas supply pipe 247a from the upstream side toward the downstream side of the second inert gas supply pipe 247a. The inert gas is supplied into the shower head 230 from the inert gas supply source 247b through the MFC 247c and the valve 247d, which are installed in the second inert gas supply pipe 247a, via the second gas supply pipe 244a and the common gas supply pipe 242.

In the first embodiment, the inert gas serves as a carrier gas or dilution gas during substrate processing. Specifically, $N_2$ gas may be used as the inert gas. Instead of $N_2$ gas, rare gases such as He gas, Ne gas and Ar gas may be used as the inert gas.

The second gas supply system 244 (also referred to as "nitrogen containing gas supply system") includes the second gas supply pipe 244a, the MFC 244c and the valve 244d. The second inert gas supply system includes the second inert gas supply pipe 247a, the MFC 247c and the valve 247d.

The second gas supply system 244 may further include the second gas supply source 244b, the remote plasma unit 244e and the second inert gas supply system. The second inert gas supply system may further include the inert gas supply source 247b, the second gas supply pipe 244a and the remote plasma unit 244e.

Since the second gas supply system 244 supplies a reaction gas or modification gas which is one of the process gases, the second gas supply system 244 is a part of the process gas supply system.

Third Gas Supply System

A third gas supply source 245b, an MFC 245c and a valve 245d are sequentially installed at the third gas supply pipe 245a from the upstream side toward the downstream side of the third gas supply pipe 245a. The inert gas is supplied into the shower head 230 from the third gas supply source 245b through the MFC 245c and the valve 245d, which are installed at the third gas supply pipe 245a, via the third gas supply pipe 245a and the common gas supply pipe 242.

The inert gas supplied from the third gas supply source 245b serves as a purge gas that purges a gas remaining in the processing vessel 202 or the shower head 230 during substrate processing. The purge gas is also referred to as "third gas". For example, $N_2$ gas may be used as the inert gas. Instead of $N_2$ gas, rare gases such as He gas, Ne gas and Ar gas may be used as the inert gas.

The first gas supply system, the second gas supply system and the third gas supply system are collectively referred to as a process gas supply part or process gas supply system. The gases supplied through the process gas supply system are collectively referred to as the process gas.

Heated Gas Supply System

A gas supply source 248b, an MFC 248c, a valve 248d and a heater 248e serving as a second heater are sequentially installed at a heated gas supply pipe 248a from the upstream side toward the downstream side of the heated gas supply pipe 248a.

A gas supplied from the gas supply source 248b (referred to as "heated gas" or "fourth gas") does not have an influence on the film formed on the wafer 200, while having high heating efficiency. The gas supplied from the gas supply source 248b includes an inert gas such as $N_2$ gas. The gas supplied from the gas supply source 248b is supplied from a heated gas supply step S104, for example.

The gas supplied from the gas supply source 248b is supplied into the processing chamber 201 through the MFC 248c, the valve 248d and the heater 248e, which are installed at the heated gas supply pipe 248a, and the heated gas supply structure 235. The heater 248e heats the gas passing through the heater 248e to a predetermined temperature according to an instruction of the controller 280.

The temperature measurement unit 249 for measuring the temperature of the heater 248e is installed at the heater 248e. The heater controller (heater control unit) 250 for controlling the heater 248e is connected to the heater 248e. The controller 280 controls the heater 248e through the heater controller 250.

Gas Exhaust System

An exhaust system (exhaust part) for exhausting the atmosphere of the processing vessel 202 includes a plurality of exhaust pipes connected to the processing vessel 202. Specifically, the exhaust system includes an exhaust pipe (first exhaust pipe) 261 connected to the transfer space 203 and an exhaust pipe (second exhaust pipe) 262 connected to the processing space 201. An exhaust pipe (third exhaust pipe) 264 is connected to the exhaust pipes 261 and 262 at the downstream sides of the respective exhaust pipes 261 and 262.

The exhaust pipe 261 is connected to a side surface or bottom surface of the transfer space 203. A TMP (Turbo Molecular Pump) 265 for providing a high vacuum or ultra-high vacuum is installed at the exhaust pipe 261. The TMP 265 is hereafter referred to as "first vacuum pump". Valves 266 and 267 serving as opening/closing valves are installed at the upstream and downstream sides of the TMP 265 of the exhaust pipe 261, respectively.

The exhaust pipe 262 is connected to a side surface of the processing space 201. An APC (Automatic Pressure Controller) 276 serving as a pressure controller is installed at the exhaust pipe 262, and controls the inner pressure of the processing space 201 to a predetermined pressure. The APC 276 includes a valve body (not illustrated) capable of adjusting an opening degree. The APC 276 adjusts the conductance of the exhaust pipe 262 according to an instruction from the controller 280. Valves 275 and 277 serving as opening/closing valves are installed at the upstream and downstream sides of the APC 276 of the exhaust pipe 262, respectively.

A DP (Dry Pump) 278 is installed at the exhaust pipe 264. Referring to FIG. 1, the exhaust pipes 262 and 261 are sequentially connected to the exhaust pipe 264 from the upstream side toward the downstream side of the exhaust pipe 264. The DP 278 is installed at the downstream side of the location where the exhaust pipes 262 and 261 are connected to the exhaust pipe 264. The DP 278 exhausts the atmospheres of the processing space 201 and the transfer space 203 through the exhaust pipe 262 and the exhaust pipe 261, respectively. When the TMP 265 is operated, the DP 278 may serve as an auxiliary pump of the TMP 265. That is, the TMP 265 serving as a high vacuum (or ultra-high vacuum) pump has difficulties in exhausting an atmosphere to the atmospheric pressure by itself. The DP 278 is used as an auxiliary pump for exhausting an atmosphere to the atmospheric pressure.

Figure 2:
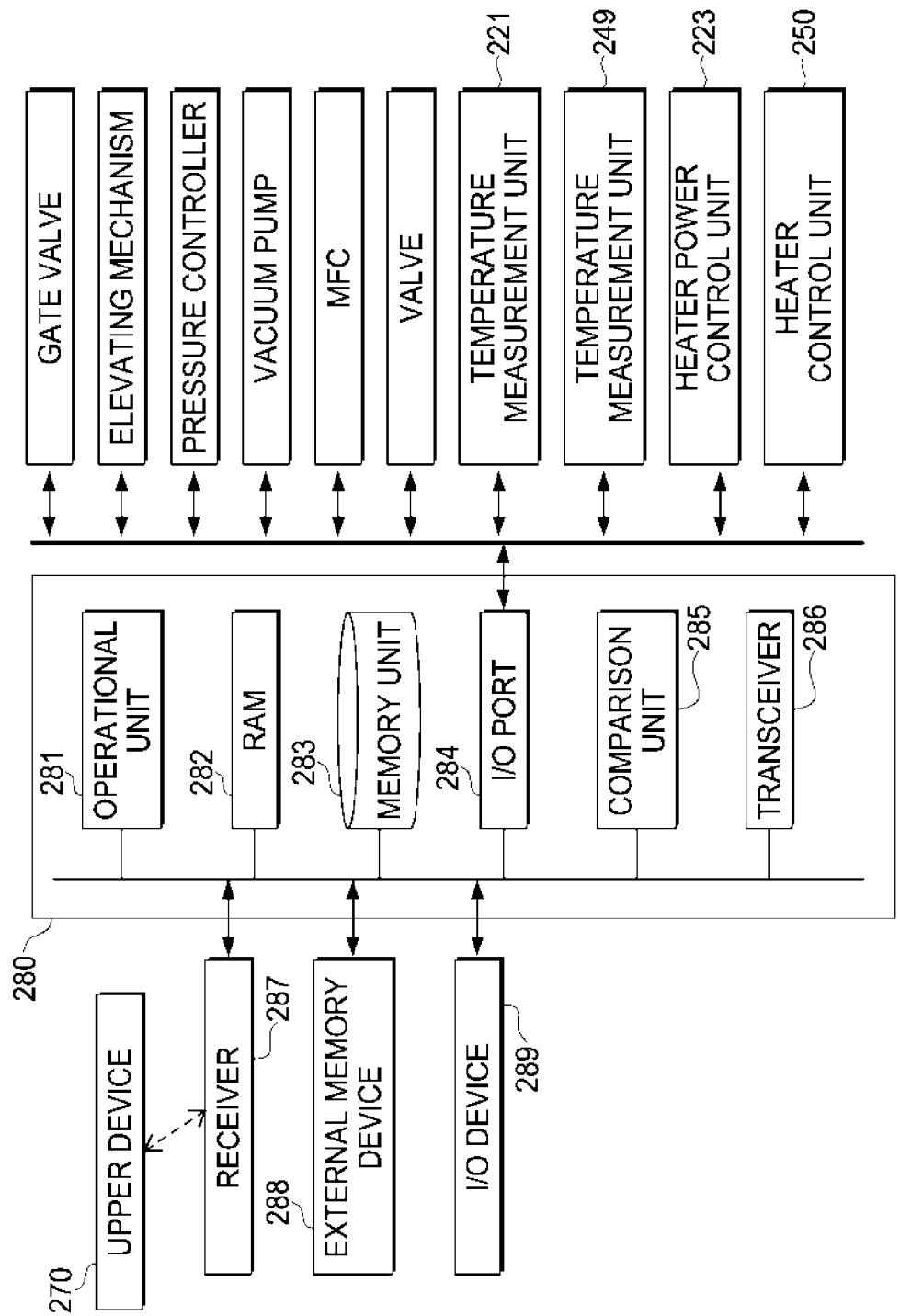
FIG. 2 is a diagram schematically exemplifying a configuration of a controller in the substrate processing apparatus according to the first embodiment described herein.

As illustrated in FIG. 1, the substrate processing apparatus 100 includes the controller 280 for controlling the operations of the components of the substrate processing apparatus 100. As illustrated in FIG. 2, the controller 280 includes an operational unit 281, a temporary memory unit (RAM) 282, a memory unit 283, an I/O port 284, a comparison unit 285 and a transceiver 286. The controller 280 is connected to the above-described components, calls at least one of a program, recipe and table from the memory unit 283 according to an instruction of an upper controller (not illustrated) or user, and controls the operations of the respective components according to the called contents. The controller 280 may further include an I/O device 289.

The controller 280 may be embodied by a dedicated computer or general use computer. For example, an external memory device 288 storing the above-described program therein may be prepared, and a program may be installed in a general use computer through the external memory device 288, in order to embody the controller 280. The external memory device 282 may include a magnetic disk such as a magnetic tape, flexible disk and hard disk, an optical disk such as CD and DVD, a magneto-optical disk such as MO, and a semiconductor memory such as a USB memory and memory card.

The unit for supplying a program to a computer is not limited to the external memory device 288. For example, the program may be directly supplied through a communication unit such as the Internet and dedicated line, without the external memory device 288. The memory unit 283 or the external memory device 288 may be embodied by a transitory computer readable recording medium. Hereafter, the memory unit 283 and the external memory device 288 are simply referred to as a recording media. In this specification, "recording media" may indicate only the memory unit 283, indicate only the external memory device 288, or indicate both of the memory unit 283 and the external memory device 288. The transceiver 286 exchanges information with other components through the I/O port 284. The transceiver 286 receives temperature information from the temperature measurement unit 221, for example. The comparison unit 285 compares information such as a table read from the memory unit 283 to information received from another component, and generates a parameter for control. The comparison unit 285 compares the information received from the temperature measurement unit 221 to the table stored in the memory unit 283, and then generates a parameter through which the heater power controller 223 controls the heater 213.

(4) Substrate Processing

Next, a process of forming a thin film on the wafer 200 using the above-described substrate processing apparatus 100 will be described as one of semiconductor manufacturing steps. In the following descriptions, the controller 280 controls the components constituting the substrate processing apparatus.

This process is based on an example of forming a silicon nitride (SiN) film as a semiconductor-based thin film on the wafer 200 by alternately supplying dichlorosilane ($SiH_2Cl_2$, abbreviated to DCS) gas and ammonia ($NH_3$) gas. The DCS gas is supplied as the first element containing gas (first process gas), and the $NH_3$ gas is supplied as the second element containing gas (second process gas).

FIG. 3 is a flowchart schematically exemplifying substrate processing according to a first embodiment. FIGS. 4A through 6B are diagrams exemplifying the operations of the substrate processing apparatus 100 at the respective steps included in the substrate processing. FIG. 7 is a flowchart exemplifying a film forming step S110 of FIG. 3 in detail.

In general, when the wafer 200 is suddenly heated through the back surface thereof, a large temperature difference occurs between the front and back surfaces of the wafer 200. Depending on the temperature difference, extensions at the front and rear surfaces of the wafer 200 may differ from each other. In this case, the wafer 200 may be bent. The characteristic of the film formed on the wafer 200 is affected by the bending of the wafer 200.

One of techniques for avoiding a bending of the wafer 200 is to gradually heat the wafer 200, for example. However, since a time is inevitably required until the wafer 200 reaches a desired temperature, throughput is degraded.

In the first embodiment, a technique capable of suppressing a bending of the wafer 200 while maintaining high throughput will be described in detail as follows.

Substrate Loading and Placing Step S102

The heater 213 or 248e requires a time until the temperature thereof is stabilized. Therefore, before the wafer 200 is loaded into the transfer chamber, at least one of the heaters 213 and 248e, or desirably both of the heaters 213 and 248e may be turned. When the temperatures of the heater 213 and 248e are stabilized, the substrate support 212 is moved downward to the position ("wafer transfer position") for transferring the wafer 200, and the lift pins 207 are passed through the through-holes 214 of the substrate support 212. As a result, the lift pins 207 protrude from the surface of the substrate support 212 by a predetermined height. Simultaneously, by exhausting the atmosphere of the transfer space 203, the inner pressure of the transfer space 203 becomes equal to or lower than that of an adjacent vacuum transfer chamber (not illustrated).

Figure 4A:
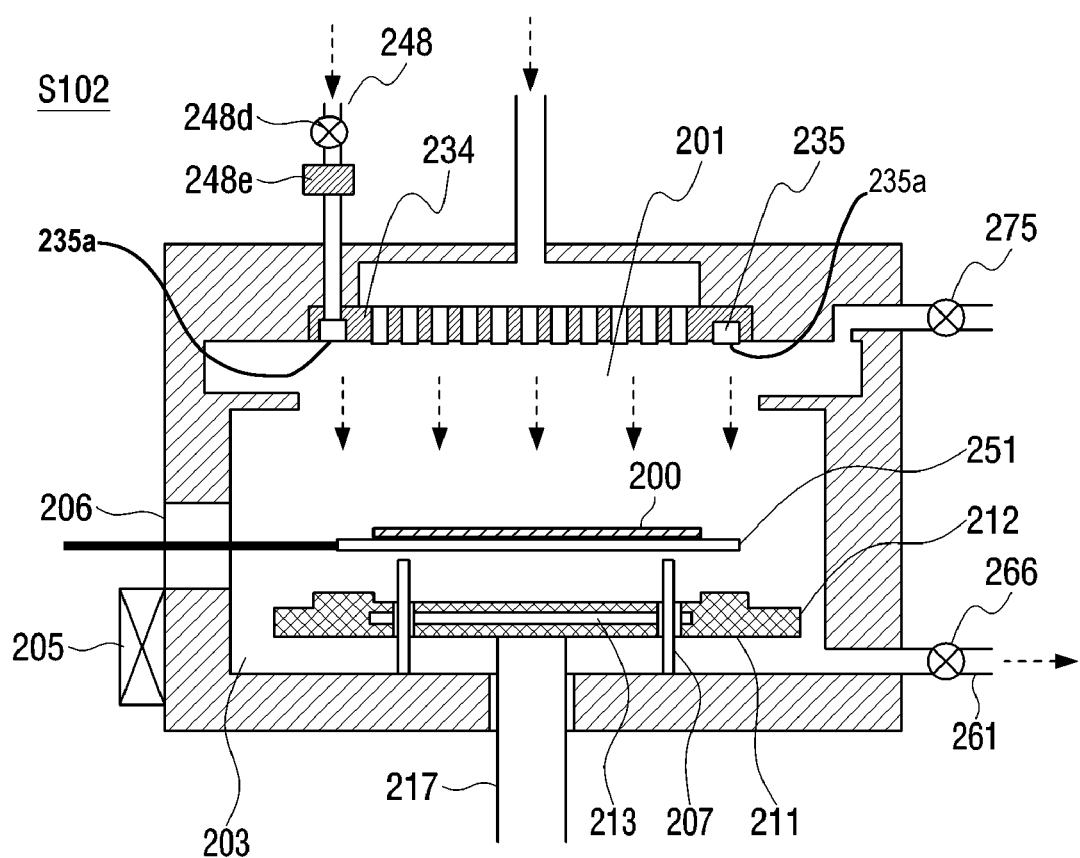
FIGS. 4A and 4B are diagrams exemplifying an operation of the substrate processing apparatus at steps included in the substrate processing according to the first embodiment described herein.

Then, the gate valve 205 is opened to connect the transfer space 203 to the adjacent vacuum transfer chamber. As illustrated in FIG. 4A, the wafer 200 is loaded into the transfer space 203 from the vacuum transfer chamber by a vacuum transfer robot 251. In order to prevent an external atmosphere from permeating into the processing chamber 201, an inert gas is supplied to the processing chamber 201 or the transfer space 203 through the third gas supply system 245 or the heated gas supply system 248, while the atmosphere of the processing chamber 201 or the transfer space 203 is exhausted through the exhaust pipe 261.

Heated Gas Supply Step S104

Figure 4B:
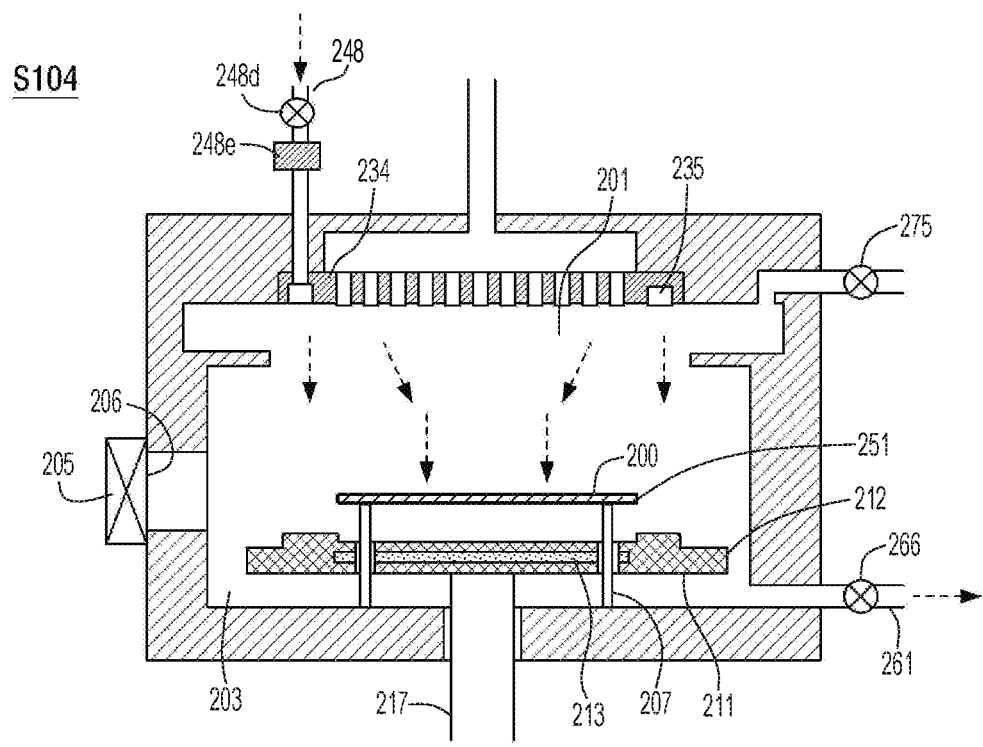

Then, as illustrated in FIG. 4A, the vacuum transfer robot 251 is moved to locate the wafer 200 above the lift pins 207, and moved downward to place the wafer 200 on the lift pins 207. After the wafer 200 is placed on the lift pins 207, the vacuum transfer robot 251 is moved to the outside of the transfer space 203. The substrate loading/unloading port 206 is closed by the gate valve 205. As illustrated in FIG. 4B, the substrate loading/unloading port 206 is closed by the gate valve 205, and the wafer 200 is placed on the lift pins 207. When the gate valve 205 is closed, the supply of the inert gas through the third gas supply system 245 is stopped, and the heated gas having been supplied through the heated gas supply system 248 is continuously supplied. The heated gas supplied through the heated gas supply system 248 is heated by the heater 248e of the heated gas supply system 248 and then supplied. The heated gas is heated to the temperature at which the wafer 200 can be heated even in a vacuum state and which is higher than the temperature of the substrate at the film forming step. For example, the temperature of the heated gas ranges from 700° C. to 800° C. The exhaust through the exhaust pipe 261 is continuously performed.

According to the related art, the wafer 200 is controlled to wait on the lift pins 207 for a predetermined time, in order to prevent a bending of the wafer 200. When the wafer 200 is directly placed on the substrate support, the wafer 200 at room temperature comes in direct contact with a susceptor at high temperature. Therefore, an excessive temperature difference occurs at each portion of the wafer 200, thereby bending the wafer 200. In order to prevent the bending of the wafer 200, the wafer 200 is controlled to wait on the lift pins 207 for a predetermined time. When the wafer 200 is controlled to wait on the lift pins 207, the wafer 200 is gradually heated by heat conduction from thereunder through a gas serving as a medium between the wafer 200 and the substrate supporter. Thus, while an excessive temperature difference does not occur between the front and back surfaces of the wafer 200, or while a bending of the wafer 200 is prevented, the temperature of the wafer 200 may be heated to a desired temperature. However, the related art does not disclose a structure for heating the wafer 200 through the upper side of the wafer 200. Therefore, heat may leak through the upper side of the wafer 200. In order to compensate for such a heat leak, the wafer 200 needs to wait on the lift pins 207 for a predetermined time. Therefore, according to the related art, the throughput may be degraded.

According to the first embodiment, the heated gas is supplied through the upper side of the wafer 200. Thus, the front surface of the wafer 200 as well as the back surface of the wafer 200 is heated. The space from the heated gas supply structure 235 to the front surface of the wafer 200, that is, the transfer space 203 and the processing space 201 are heated.

Specifically, the transfer space 203 and the processing space 201 are heated as follows. The heated gas is diffused in the transfer space 203 as indicated by arrows of FIG. 4B, and supplied onto the front surface of the wafer 200, thereby heating the wafer 200. At this time, the heated gas is also supplied between the substrate placing surface 211 and the back surface of the wafer 200. The front and back surfaces of the wafer 200 are heated by the heated gas supplied through the upper side of the wafer 200 and the heated gas supplied through the back surface of the wafer 200, respectively. In the first embodiment, a temperature difference between the front and back surfaces of the wafer 200 falls in a predetermined temperature range in which the wafer 200 is not bent.

Since the heated gas is diffused in the transfer space 203 or the processing space 201, the atmosphere of the transfer space 203 or the processing space 201 is heated. Therefore, no heat leaks from the wafer 200. Thus, the temperature of the wafer 200 rapidly rises. As a result, a temperature difference between the heater 213 and the wafer 200 rapidly decreases. Therefore, the wafer 200 may be transferred without waiting on the lift pins 207 for a predetermined time.

As described above, the transferred wafer 200 may be heated more rapidly and uniformly that in the related art. Therefore, a bending of the wafer 200 does not occur. Furthermore, since the wafer 200 does not need to wait on the lift pins 207, the waiting time can be shortened while throughput is improved.

By supplying the heated gas through the heated gas supply structure 235, the dispersion part 234 may be heated before a film forming step S110 described later. By heating the dispersion part 234 in advance, the wafer 200 can be rapidly heated at the film forming step S110.

Wafer Moving Step S106

Figure 5A:
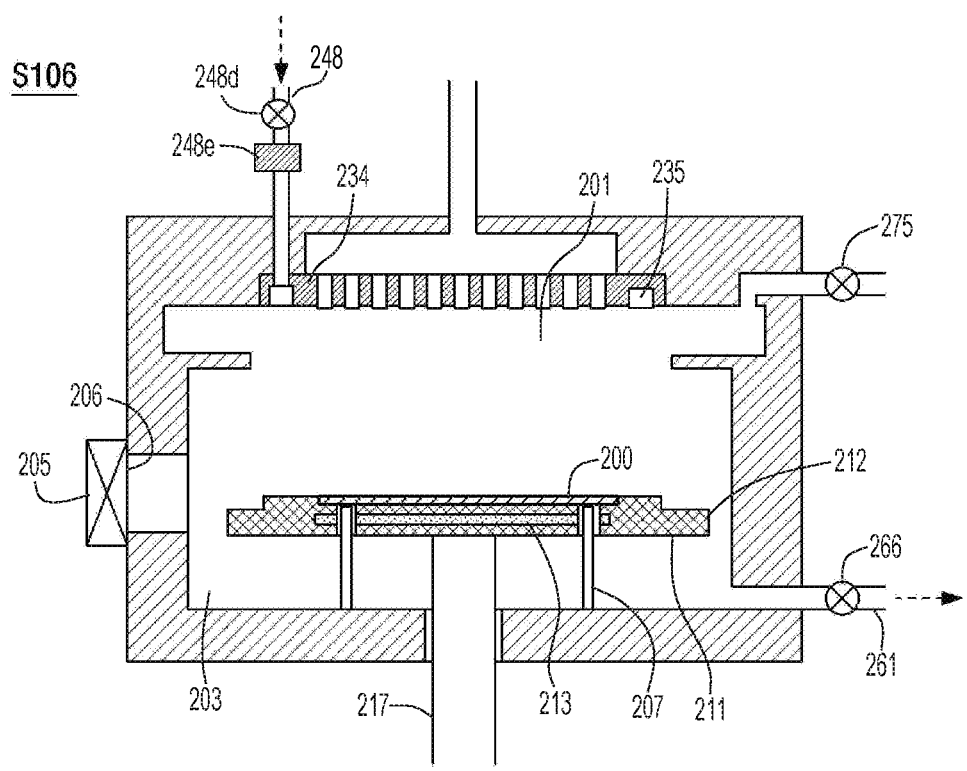
FIGS. 5A and 5B are diagrams exemplifying an operation of the substrate processing apparatus at the steps included in the substrate processing according to the first embodiment described herein.
Figure 5B:
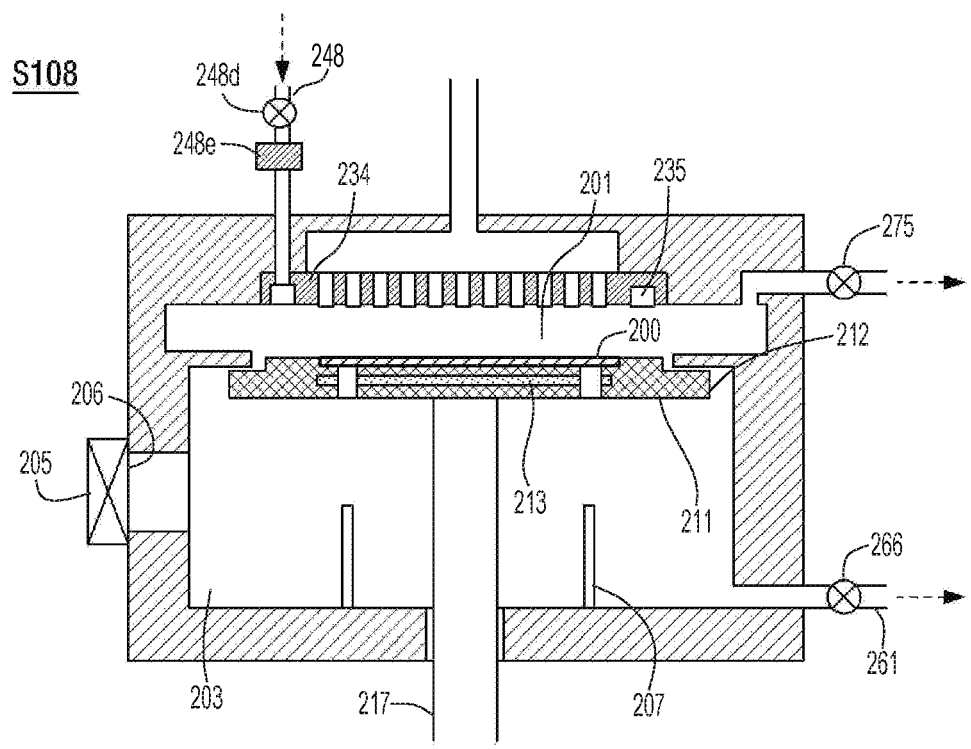
Figure 6A:
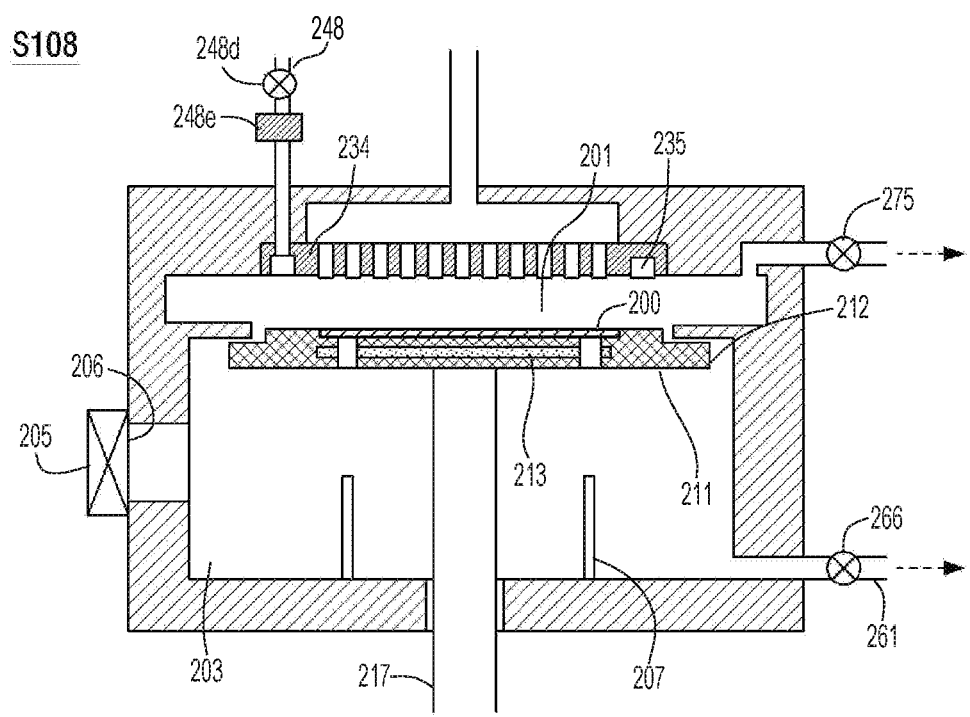
FIGS. 6A and 6B are diagrams exemplifying an operation of the substrate processing apparatus at the steps included in the substrate processing according to the first embodiment described herein.

After a predetermined has passed, the substrate support 212 is moved upward to place the wafer 200 on the substrate placing surface 211 as illustrated in FIG. 5A. Furthermore, as illustrated in FIG. 5B, the substrate support 212 is moved upward until the substrate support 212 reaches the wafer processing position. The heated gas heats the wafer 200 while being continuously supplied through the heated gas supply system 248, until the substrate support 212 having the wafer 200 placed thereon is moved to the wafer processing position from the wafer transfer position. The wafer processing position is where the wafer 200 is processed by the process gas. The wafer processing position is where the level of the surface of the substrate support 212 is equal to the level of a barrier wall 204, as illustrated in FIG. 1 or 5B.

Separated Substance Removing Step S108

The film formed on the wafer 200 contains a large amount of impurities. The impurities include reaction byproducts or elements of a gas which is used when a predetermined treatment is performed in another processing chamber (not illustrated) other than the processing chamber 201, before the wafer 200 is loaded into the processing chamber 201. The impurities include fluoride and carbon-based residues generated from elements of an etching gas such as sulfur hexafluoride ($SF_6$) gas and carbon tetrafluoride ($CF_4$) gas. By heating the wafer 200 to high temperature, the separation of such impurities from the film may be promoted.

Recently, with the reduction in size of semiconductor devices, the surface area of a film has tended to increase. Therefore, the amount of impurities included in the film has also tended to increase. Thus, when the wafer 200 is continuously heated at high temperature, impurities are continuously separated. For example, when the amount of separated impurities is larger than the amount of exhausted impurities, the impurities may stay on the wafer 200. For example, more impurities are present in the atmosphere above the center of the wafer 200, where the exhaust efficiency is low, than the atmospheres of the other portions thereof. Furthermore, less impurities are present in the atmosphere above the outer circumference of the wafer 200, where the exhaust efficiency is high, than the atmospheres of the other portions thereof. In this situation, when the source gas is supplied, separated substances stay between the source gas and the surface of the wafer 200. In this case, the source gas cannot reach the surface of the wafer 200 or the amount of source gas reaching the surface of the wafer 200 becomes insufficient. Therefore, locations where a film is formed and locations where no film is formed are present on the wafer 200, which makes it difficult to uniformly process the wafer 200 while lowering the yield.

At this step, the separated substances are removed from the atmosphere on the surface of the wafer 200, before the process gas is supplied. Specifically, as illustrated in FIG. 6A, the supply of the heated gas is stopped, and the atmosphere of the processing chamber 201 is exhausted. Then, the separated substances from the wafer 200 heated by the heated gas may be removed. Since the separated substances are removed in advance, DCS gas may be then uniformly supplied as a process gas to the wafer 200. So far, the separated substance removing step S108 performed after the substrate support 121 reaches the wafer processing position has been described. However, as long as the separated substances can be removed, the separated substance removing step S108 may be performed when the substrate support 212 is located between the wafer transfer position and the wafer processing position. Desirably, the separated substance removing step S108 may be performed when the temperature of the wafer 200 is stabilized after the substrate support 212 reaches the wafer processing position.

Film Forming Step S110

Next, referring to FIG. 7, the film forming step S110 will be described in detail. The film forming step S110 is a cyclic process of repeating a step of alternately supplying different process gases.

Referring to FIG. 7, the film forming step S110 will be described in detail.

First Process Gas Supply Step S202

Figure 6B:
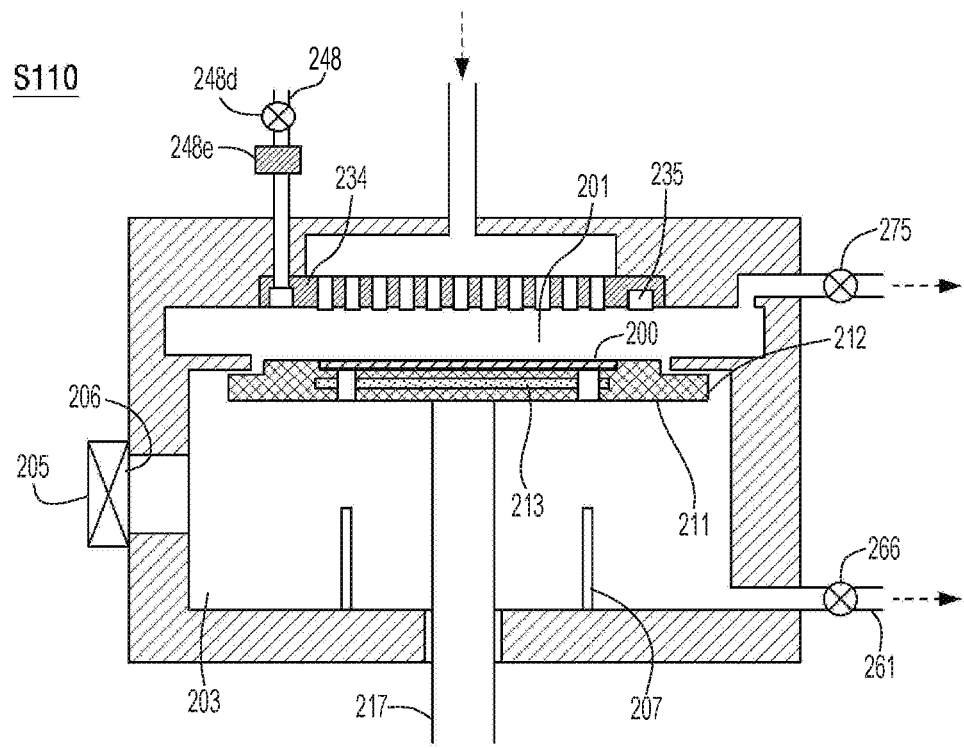
Figure 7:
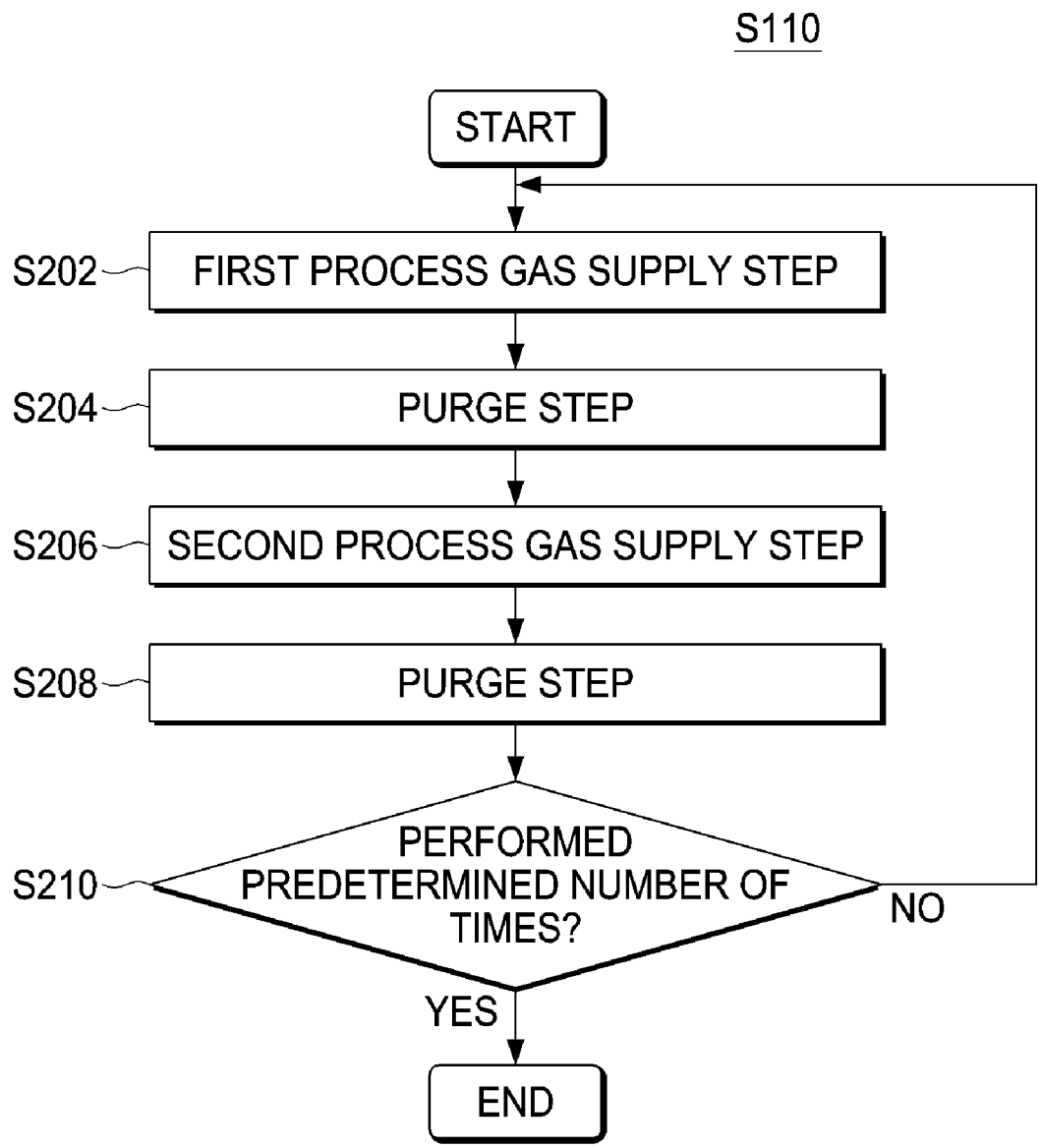
FIG. 7 is a flowchart exemplifying a film forming step included in the substrate processing according to the first embodiment described herein.

When the substrate support 212 is moved to the wafer processing position as illustrated in FIG. 6B, the atmosphere of the processing chamber 201 is exhausted through the exhaust pipe 262. Then, the inner pressure of the processing chamber 201 is adjusted. Since the dispersion part 234 is already heated, a small amount of heat is transmitted to the dispersion part 234 from the heater 213 when the temperature of the wafer 200 is adjusted. Therefore, the wafer 200 may be rapidly heated.

When the temperature of the wafer 200 reaches a predetermined temperature of 500° C. to 600° C., for example, while the inner pressure of the processing chamber 201 is adjusted to a predetermined pressure, the process gas, for example, DCS gas is supplied to the processing chamber through the common gas supply pipe 242. The supplied DCS gas forms a silicon-containing layer on the wafer 200.

Purge Step S204

After the supply of DCS gas is stopped, N2 gas is supplied through the third gas supply pipe 245a, and purges the processing space 201. At this time, with the valves 275 and 277 open, the APC 276 adjusts the pressure of the processing space 201 to a predetermined pressure. The valves of the exhaust system except the valves 275 and 277 are all closed. Thus, DCS gas which is not coupled to the wafer 200 at the first process gas supply step S202 is removed from the processing space 201 through the exhaust pipe 262 by the DP 278.

At the purge step S204, a large amount of purge gas is supplied in order to exclude the DCS gas remaining in the wafer 200, the processing space 201 and the shower head buffer chamber 232. Therefore, the exhaust efficiency can be improved.

More desirably, while $N_2$ gas is supplied through the third gas supply pipe 245a, the heated gas is supplied through the heated gas supply system 248. Hereafter, the reason will be described. At this step, in order to remove the DCS gas remaining on the wafer 200 as described above, a large amount of $N_2$ gas is supplied through the third gas supply pipe 245a and the dispersion part 234. Therefore, the large amount of $N_2$ gas takes heat of the dispersion part 234. As a result, the temperature of the dispersion part 234 drops. Simultaneously, the temperature of the wafer 200 or the substrate support 212 is varied. When the temperature of the wafer 200 or the substrate support 212 is varied, an incubation time may be varied or the thickness or quality of the film may be varied. Therefore, the temperatures of the dispersion part 234, the wafer 200 and the substrate support 212 need to be maintained.

At this step, the heated gas having a higher temperature than $N_2$ gas supplied through the third gas supply pipe 245a is supplied through the heated gas supply system 248. Since the heated gas passes through the gas supply pipe 236 and the heated gas supply structure 235, the dispersion part 234 is also heated, which makes it possible to suppress a drop in temperature of the dispersion part 234. Therefore, since a variation in temperature of the component such as the wafer 200 is suppressed, it is possible to suppress a problem such as a variation of the incubation time or variation in thickness or quality of the film.

When the purge is ended, pressure control is resumed. When the heated gas has been supplied at the purge step S204, the supply of the heated gas is stopped. At this time, by continuously supplying $N_2$ gas through the third gas supply pipe 245a, the shower head 230 and the processing space 201 are continuously purged.

Second Process Gas Supply Step S206

When the purging of the shower head buffer chamber 232 and the processing space 201 is completed, a second process gas supply step S206 is performed. At the second process gas supply step S206, the valve 244d is opened to supply $NH_3$ gas as the second process gas (second element containing gas) into the processing space 201 through the remote plasma unit 244e and the shower head 230. The MFC 244c adjusts the flow rate of the supplied $NH_3$ gas to a predetermined flow rate. The flow rate of the supplied $NH_3$ gas ranges from 1,000 sccm to 10,000 sccm. Since the valve 245d of the third gas supply system is opened even at the second process gas supply step S206, $N_2$ gas is supplied through the third gas supply pipe 245a. Therefore, the $N_2$ gas prevents a permeation of $NH_3$ gas into the third gas supply system.

The $NH_3$ gas changed into a plasma state by the remote plasma unit 244g is supplied into the processing space 201 through the shower head 230. The supplied $NH_3$ gas reacts with the silicon containing layer on the wafer 200. The silicon containing layer formed on the wafer 200 is modified by the plasma of the $NH_3$ gas. Thus, a silicon nitride (SiN) layer containing silicon and nitrogen elements, for example, is formed on the wafer 200.

When a predetermined has elapsed after the $NH_3$ gas was supplied, the valve 244d is closed to stop the supply of $NH_3$ gas. The supply duration of $NH_3$ gas ranges from 2 seconds to 20 seconds.

At the second process gas supply step S206, with the valves 275 and 277 open, the pressure of the processing space 201 is controlled to a predetermined pressure by the APC 276, as in the first process gas supply step S202. The valves of the exhaust system except the valves 275 and 277 are all closed.

Purge Step S208

After the supply of $NH_3$ gas is stopped, the same purge step S208 as the above-described purge step S204 is performed. Since the operations of the respective components at the purge step S208 are performed in the same manner as the above-described purge step S204, the detailed descriptions thereof are omitted herein.

Determination Step S210

The controller 280 determines whether a cycle was performed a predetermined number of times (n times), the cycle including the first process gas supply step S202, the purge step S204, the second process gas supply step S206 and the purge step S208. By performing the cycle the predetermined number of times, a SiN layer having a desired film thickness is formed on the wafer 200.

Wafer Moving Step S112

Referring back to FIG. 3, the substrate support 212 having the wafer 200 placed thereon is moved downward to the wafer transfer position, after the SiN film having a desired thickness is formed. At the step S112, an inert gas is supplied through the third gas supply system 245, thereby adjusting the pressure.

When the substrate support 212 is moved downward, the dispersion part 234 has difficulties in receiving the influence of the heater 213. Therefore, the temperature of the dispersion part 234 may be lowered. As described above, the dispersion part 234 may be heated at the film forming step S110. However, when the temperature of the dispersion part 234 is lowered, a time is required until the temperature of the dispersion part 234 is raised to a desired temperature. Therefore, it takes a time to heat the wafer 200 to the desired temperature.

Thus, by supplying the heated gas through the heated gas supply structure 235, the temperature of the dispersion part 234 is retained. Since the heated gas passing through the heated gas supply structure 235 comes in contact with the dispersion part 234, the heated gas can prevent a drop in temperature of the dispersion part 234.

Substrate Unloading Step S114

At a substrate unloading step S114, the processed wafer 200 is unloaded from the processing vessel 202 in the reverse sequence to the above-described substrate loading and placing step S102. Then, an unprocessed wafer 200 on stand-by may be loaded into the processing vessel 202 in the same sequence as the substrate loading and placing step S102. Then, the steps following the heated gas supply step S104 may be performed on the loaded unprocessed wafer 200.

Second Embodiment

Next, a second embodiment will be described. The second embodiment includes heated gas supply holes having a different structure from the first embodiment. The heated gas supply structure 235 according to the first embodiment is circumferentially disposed at the outer circumference of the dispersion part 234, but a heated gas supply structure 252 according to the second embodiment is disposed on the entire surface of the dispersion part 234 along the radial direction thereof.

Figure 8:
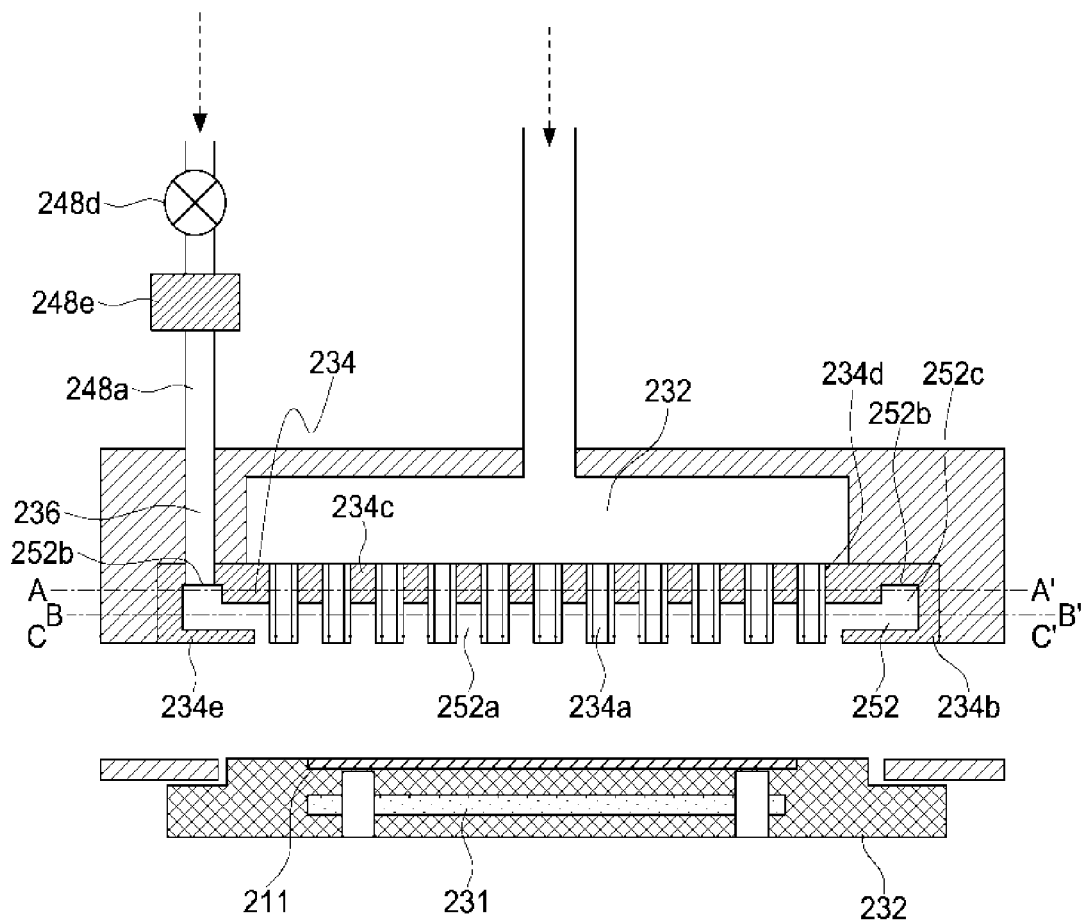
FIG. 8 is a diagram schematically exemplifying a shower head and components therearound according to a second embodiment described herein.
Figure 9A:
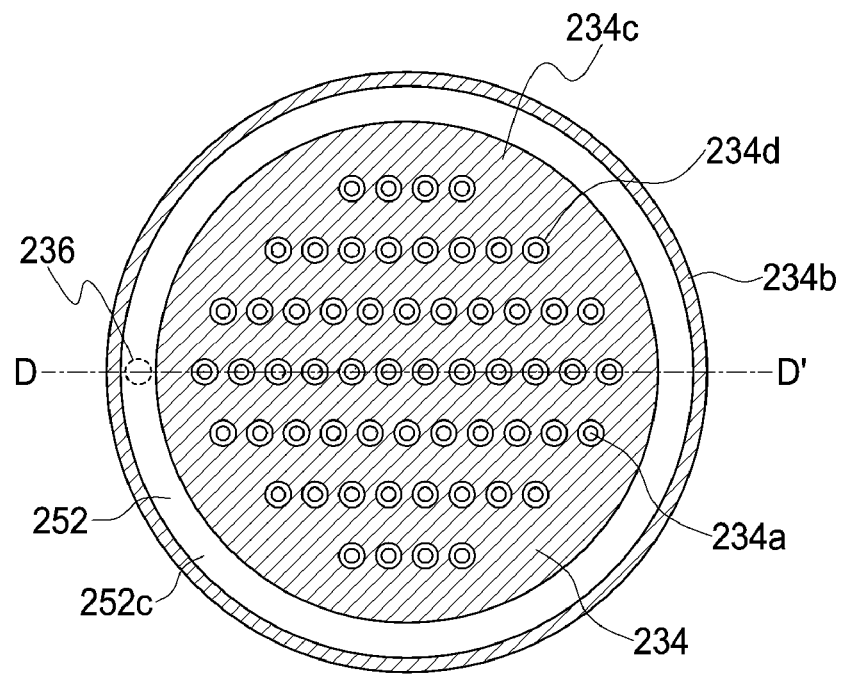
FIGS. 9A through 9C are diagrams schematically exemplifying a dispersion part according to the second embodiment described herein.
Figure 9B:
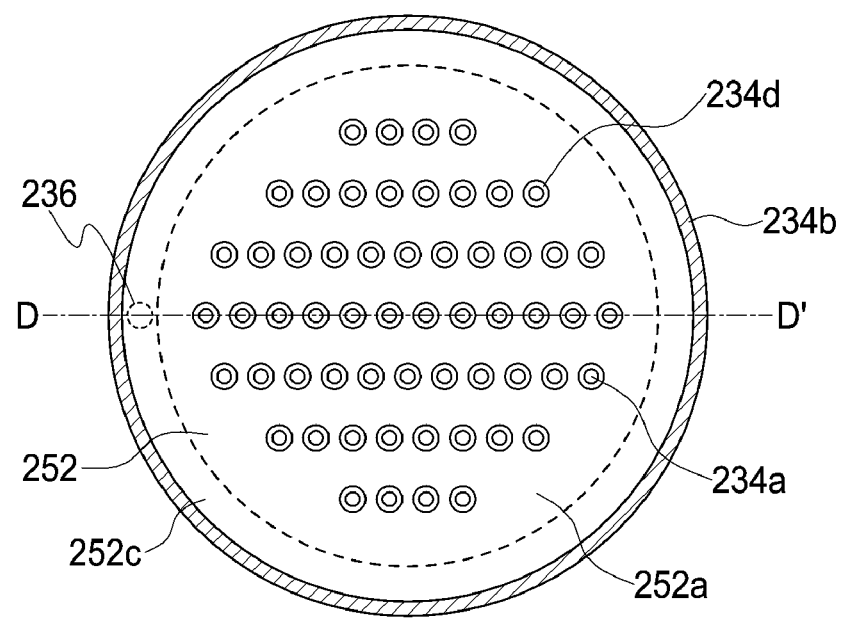
Figure 9C:
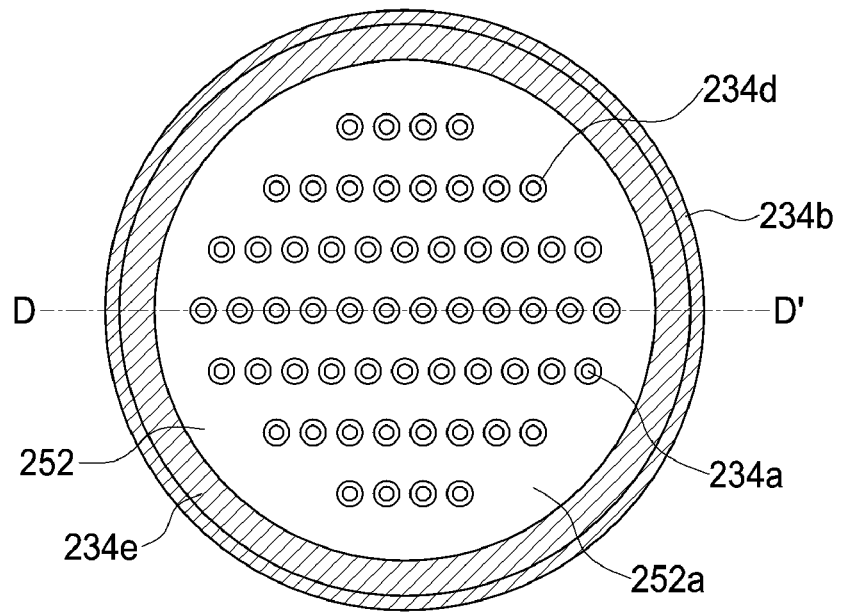

Hereafter, referring to FIGS. 8 and 9A through 9C, the second embodiment will be described. FIG. 8 is a vertical cross-sectional view of the shower head 230, and FIGS. 9A through 9C are views of the dispersion part 234 seen from the substrate placing surface 211. Specifically, FIG. 8 is a cross-sectional view taken along the D-D' line of FIG. 9A, 8B or 8C. FIG. 9A is a cross-sectional view taken along the A-A' line of FIG. 8, FIG. 9B is a cross-sectional view taken along the B-B' line of FIG. 8, and FIG. 9C is a cross-sectional view taken along the line C-C' of FIG. 8.

As illustrated in FIG. 8, the heated gas supply structure 252 is connected to the heated gas supply pipe 248a through the gas supply pipe 236. The heated gas supply structure 252 is a part of the dispersion part 234. The dispersion part 234 is open toward the substrate placing surface 211. The heated gas supply structure 252 includes an upper part 234c and a side part 234b, which face the substrate placing surface 211. In the second embodiment, a region surrounded by the upper part 234c and the side part 234b is referred to as a gas retention space 252a. The upper part 234c has a circular shape as illustrated in FIG. 9A.

As illustrated in FIGS. 8 and 9A through 9C, through-holes 234a are disposed in the dispersion part 234. Each of the through-holes 234a includes a cylindrical structure 234d. The cylindrical structure 234d is installed through the upper part 234c of the dispersion part 234. The upstream side of the cylindrical structure 234d communicates with the shower head buffer chamber 232, and the downstream side of the cylindrical structure 234d communicates with the processing space 201.

A recess 252b having a surface at a higher level than the bottom surface of the upper part 234c is circumferentially disposed at the outer circumference of the upper part 234c. A buffer space 252c is disposed under the recess 252b. That is, as illustrated in FIG. 9A, the circumferential buffer space 252c is disposed at the outer circumference of the upper part 234c. A gas supply pipe 236 is connected to the surface of the recess 252b. Thus, the buffer space 252c communicates with the heated gas supply system 248.

As illustrated in FIGS. 8, 9A and 9B, the gas retention space 252a is constituted by the outer surface of the cylindrical structure 234d, the upper part 234c, the side part 234b and the recess 252b.

The heated gas supplied through the heated gas supply system 248 is supplied to the buffer space 252c through the gas supply pipe 236. A part of the heated gas is supplied to the gas retention space 252a while flowing along the buffer space 252c. The gas retention space 252a is filled with the heated gas.

As described above, the contact area between the heated gas and the dispersion part 234 is increased by the heated gas supply structure having the gas retention space 252a. Therefore, since the dispersion part 234 is efficiently heated, a drop in temperature of the dispersion part 234 can be suppressed.

More desirably, as illustrated in FIG. 8, at least the frond end of the cylindrical structure 234d toward the substrate placing surface 211 protrudes to the gas retention space 252a through the upper part 234c. When the front ends of the plurality of cylindrical structures 234d are present in the gas retention space 252a, the heated gas is retained between the respective cylindrical structures 234d. Therefore, the heating efficiency of the dispersion part 234 can be raised.

More desirably, as illustrated in FIGS. 8 and 9C, the lower part 234e may be installed under the recess 252b. That is, the heated gas supply structure 252 may further include the lower part 234e among the components of the dispersion part 234. The lower part 234e has a cavity disposed at least at a location facing the substrate placing surface 211. That is, the cavity of the lower part 234e is disposed at the center thereof. The outer circumference of the lower part 234e has a continuous plate shape. That is, the lower part 234e is formed in a donut shape. Since the supplied heated gas collides with the lower part 234e and flows toward the center of the heated gas supply structure 252, the heated gas may be more reliably supplied to the central portion of the dispersion part 234. Therefore, the heating efficiency of the dispersion part 234 can be more reliably raised.

Third Embodiment

Next, a third embodiment will be described. The third embodiment is different from the second embodiment in that the lower part installed under the buffer space 252c has a different shape.

Figure 10:
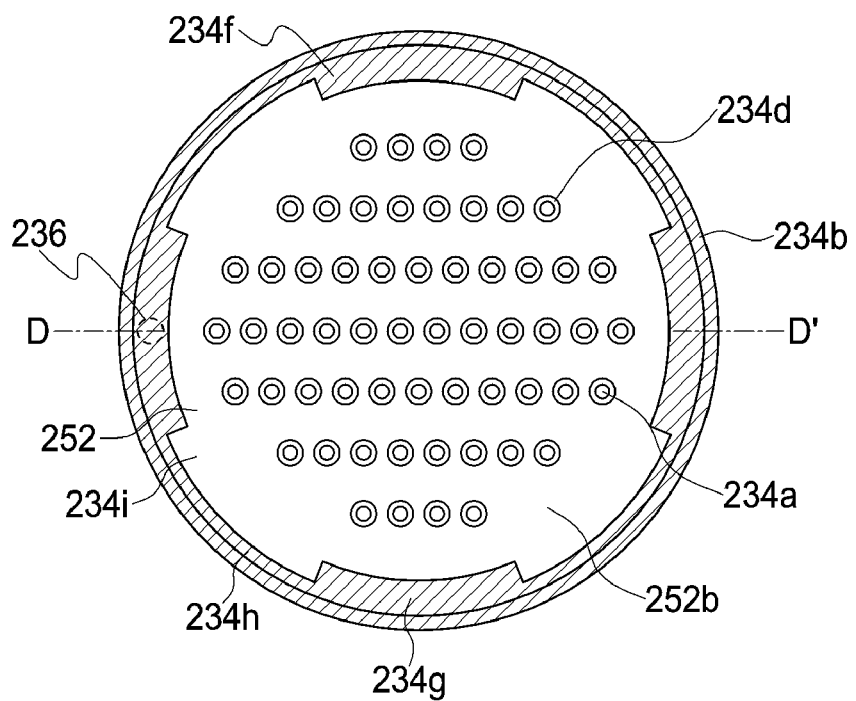
FIG. 10 is a diagram schematically exemplifying a dispersion part according to a third embodiment described herein.

Hereafter, referring to FIG. 10, the third embodiment will be described. FIG. 10 is a view of the dispersion part 234 seen from the substrate placing surface 211, corresponding to FIG. 9C of the second embodiment. Since the other components of the third embodiment have the same structures as those of the first and second embodiments, the descriptions thereof are omitted herein.

The lower part 234f in the third embodiment is disposed under at least the recess 252b like the lower part 234e in the second embodiment, but has a different structure from the lower part 234e. Hereafter, the difference therebetween will be described. As illustrated in FIG. 10, the lower part 234f includes main portions 234g and connection portions 234h. The main portions 234g induce a flow of heated gas, and the connection portions 234h connects the adjacent main portions 234g. At least one of the main portions 234g is disposed under at least the supply hole of the gas supply pipe 236. The supplied heated gas collides with the main portion 234g disposed at the bottom of the supply hole of the gas supply pipe 236. As illustrated in FIG. 10, the main portions 234g are circumferentially arranged along the side part 234b. The main portions 234g protrude toward the center of the gas retention space 252a with respect to the connection portion 234h. In other words, the connection portion 234h has a width smaller by a gap 234i than the main portions 234g. As such, the main portions 234g are intermittently arranged.

The heated gas supplied through the gas supply pipe 236 collides with the main portions 234g, and flows to the gas retention space 252a as in the second embodiment. Therefore, the heating efficiency of the dispersion part 234 may be improved. The heated gas which does not collide with the main portions 234g is supplied to the processing space 201 through the gaps 234i. Thus, the heated gas maintained at high temperature is supplied to the transfer space 203 or the processing space 201. In this way, the heating efficiency for the wafer 200 at the heated gas supply step S104 can be improved. That is, according to the configuration of the third embodiment, both of the dispersion part 234 and the transfer space 203 can be efficiency heated.

In the third embodiment, the configuration that the main portions 234g are connected through the connection portions 234h has been described. However, the third embodiment is not limited thereto. For example, between the main portions 234g, only the gap 234i may be disposed without the connection portion 234h. When only the gap 234i is formed, the collision area of the heated gas decreases. Therefore, the heated gas maintained at high temperature may be supplied to the transfer space 203 or the processing space 201.

In the third embodiment, the structure in which the main portions 234g are intermittently arranged has been described. However, the third embodiment is not limited thereto. For example, the gap 234i may be disposed at least under the gas supply pipe 236. According to the above-described configuration, a larger amount of heated gas maintained at high temperature can be supplied to the transfer space 203 or the processing space 201.

Other Embodiments

So far, the embodiments have been described in detail. However, the technique described herein is not limited to the embodiments. The technique described herein may be changed in various manners without departing the scope of the disclosure.

For example, the above-described embodiments have been based on the example in which the SiN film is formed on the wafer 200 through the film forming process of alternately supplying DCS gas and NH$_3$ gas as the first element containing gas (first process gas) and the second element containing gas (second process gas), respectively, the film forming process being performed by the substrate processing apparatus. However, the technique described herein is not limited thereto. That is, the process gas used for the film forming process is not limited to the DCS gas or NH$_3$ gas. For example, even when different kinds of gases are used to form a different kind of thin film, the technique described herein may be applied. The technique described herein may be applied even when three kinds or more of process gases are used and sequentially and repeatedly supplied to perform the film forming process. Specifically, the first element may include elements such as titanium (Ti), zirconium (Zr) and hafnium (Hf), instead of Si. The second element may include an element such as argon (Ar), instead of N.

The above-described embodiments have been based on the example that the process performed by the substrate process apparatus is the film forming process. However, the technique described herein is not limited thereto. That is, the technique described herein may be applied to not only the film forming process exemplified in each of the embodiments, but also a film forming process of forming a thin film different from the thin film exemplified in each of the embodiments. The specific contents of the substrate processing are omitted herein. Furthermore, the technique described herein may be applied to other substrate processing such as annealing, diffusion, oxidation, nitridation and lithography, as well as the film forming process. The technique described herein may applied to other substrate processing apparatuses such as an annealing apparatus, etching apparatus, oxidizing apparatus, nitriding apparatus, exposure apparatus, application apparatus, drying apparatus, heating apparatus and processing apparatus using plasma. The technique described herein may also be applied when such apparatuses are used together. A part of the components included in any one of the above-described embodiments can be replaced with components of another embodiment, and components of any one embodiment can be added to components of another embodiment. A part of components in each of the embodiments may be added to other components, or removed or replaced with other components.

According to the technique described herein, it is possible to improve the characteristic of a film formed on the surface of a wafer, using a single-wafer type substrate processing apparatus which heats and processes a wafer.

What is claimed is:

1. A substrate processing apparatus comprising:
a processing vessel where a substrate is processed;
a dispersion part disposed at an upstream side of the processing vessel;
a substrate supporter comprising: a first heater configured to heat the substrate to a first temperature; and a substrate placing surface where the substrate is placed;
a heated gas supply system comprising: a gas supply pipe connected to a peripheral portion of the dispersion part and configured to supply an inert gas and a second heater installed at the gas supply pipe installed at the peripheral portion of the dispersion part and configured to heat the inert gas passing through the gas supply pipe, wherein the heated gas supply system is configured to supply a heated inert gas into the processing vessel; and
a controller, embodied by a computer, configured to control the first heater and the second heater such that a temperature of a front surface of the substrate and a temperature of a back surface of the substrate are in a predetermined range.

2. The substrate processing apparatus of claim 1, wherein the substrate supporter is configured to move up and down between a substrate processing position when the substrate is processed and a substrate transfer position when the substrate is transferred.

3. The substrate processing apparatus of claim 2, wherein the controller is further configured to control the heated gas supply system to continue supplying the heated inert gas while the substrate is being moved from the substrate transfer position to the substrate processing position in a state where a processing surface of the substrate faces the dispersion part.

4. The substrate processing apparatus of claim 3, further comprising:
a process gas supply system comprising at least one additional gas supply pipe configured to supply a process gas to the processing vessel; and
an exhaust system comprising at least one exhaust pipe configured to exhaust an inner atmosphere of the processing vessel,
wherein the controller is further configured to control the heated gas supply system, the process gas supply system and the exhaust system to: stop a supply of the heated inert gas and exhaust an atmosphere of the processing vessel when the substrate is moved to the substrate processing position; and then supply the process gas into the processing vessel.

5. The substrate processing apparatus of claim 2, further comprising:
a process gas supply system comprising at least one additional gas supply pipe configured to supply a process gas to the processing vessel; and
an exhaust system comprising at least one exhaust pipe configured to exhaust an inner atmosphere of the processing vessel,
wherein the controller is further configured to control the heated gas supply system, the process gas supply system and the exhaust system to: stop a supply of the heated inert gas and exhaust an atmosphere of the processing vessel when the substrate is moved to the substrate processing position; and then supply the process gas into the processing vessel.

6. The substrate processing apparatus of claim 1, further comprising:
a process gas supply system configured to supply a process gas into the processing vessel,
wherein the controller is further configured to control the process gas supply system and the heated gas supply system to: process the substrate by supplying the process gas into the processing vessel; and stop a supply of the process gas and supply the heated inert gas after the substrate is processed.

7. The substrate processing apparatus of claim 1, further comprising:
a process gas supply system configured to supply a first gas, a second gas and a purge gas into the processing vessel,
wherein the controller is further configured to control the process gas supply system and the heated gas supply system to: process the substrate by alternately and repeatedly supplying the first gas and the second gas into the processing vessel while supplying the purge gas; and supply the heated inert gas while the purge gas is supplied.

8. The substrate processing apparatus of claim 1, further comprising a heated gas supply structure comprising a gas retention space disposed to face the substrate placing surface.

9. The substrate processing apparatus of claim 1, further comprising:
a process gas supply system comprising at least one additional gas supply pipe configured to supply a process gas to the processing vessel via through holes; and
a heated gas supply structure comprising a gas retention space disposed to face the substrate placing surface,
wherein the through holes and the heated gas supply structure are provided in the dispersion part.

10. The substrate processing apparatus of claim 9, wherein the heated gas supply structure comprises: an upper part provided above the gas retention space; and a side part disposed at a side of the gas retention space.

11. The substrate processing apparatus of claim 10, wherein the heated gas supply structure further comprises a recess disposed along a circumference of the upper part and serving as a buffer space connected to the heated gas supply structure.

12. The substrate processing apparatus of claim 11, wherein the heated gas supply structure further comprises a lower part disposed under the buffer space.

13. The substrate processing apparatus of claim 12, wherein the lower part has a cavity at a center thereof and comprises main portions disposed along a circumference thereof in a manner separate from one another, each of the main portions extruding toward the center.

14. The substrate processing apparatus of claim 9, wherein each of the through holes is defined by a cylindrical structure, and a front end of the cylindrical structure protrudes toward the substrate placing surface from an upper part of the heated gas supply structure.

15. The substrate processing apparatus of claim 14, wherein the heated gas supply structure further comprises a recess disposed along a circumference of the upper part and serving as a buffer space connected to the heated gas supply structure.

16. The substrate processing apparatus of claim 15, wherein the heated gas supply structure further comprises a lower part disposed under the buffer space.

17. The substrate processing apparatus of claim 16, wherein the lower part has a continuous plate shape with a cavity at a center thereof.

18. The substrate processing apparatus of claim 16, wherein the lower part has a cavity at a center thereof and comprises main portions disposed along a circumference thereof in a manner separate from one another, each of the main portions extruding toward the center.

19. The substrate processing apparatus of claim 1, wherein the heated gas supply system further comprises a gas supply source, a mass flow controller, and a valve sequentially installed from an upstream side toward a downstream side of the gas supply pipe and wherein the heated gas supply system is configured to supply the heated inert gas between the substrate placing surface and the back surface of the substrate.

20. The substrate processing apparatus of claim 1, further comprising:
a heated gas supply structure including a plurality of supply holes to supply the heated inert gas into the processing vessel,
wherein the dispersion part is configured to dispense other gases via a plurality of through holes,
wherein the gas supply pipe is connected to an upstream side of a heated gas supply structure, and
wherein the plurality of supply holes are disposed at different locations from the plurality of through holes.

* * * * *